(12) United States Patent
Choi et al.

(10) Patent No.: US 7,148,674 B2
(45) Date of Patent: Dec. 12, 2006

(54) APPARATUS FOR AUTOMATICALLY MEASURING A RELATIVELY WIDE RANGE OF LEAKAGE CURRENTS

(75) Inventors: In Hyuk Choi, Daejeon (KR); Dong Il Lee, Daejeon (KR); Jeong Shik Ahn, Daejeon (KR); Gil Jo Jung, Daejeon (KR); Jang Hyun Choi, Daejeon (KR)

(73) Assignee: Korea Electric Power Corporation (KR)

( * ) Notice: Subject to any disclaimer, the term of this patent is extended or adjusted under 35 U.S.C. 154(b) by 11 days.

(21) Appl. No.: 10/929,807

(22) Filed: Aug. 30, 2004

(65) Prior Publication Data

US 2005/0088196 A1    Apr. 28, 2005

(30) Foreign Application Priority Data

Oct. 25, 2003   (KR) .................. 10-2003-0074891

(51) Int. Cl.
*G01R 15/09*   (2006.01)
*G01R 31/12*   (2006.01)
*G08C 19/00*   (2006.01)

(52) U.S. Cl. .................. 324/115; 324/551; 340/870.01

(58) Field of Classification Search .................. None
See application file for complete search history.

(56) References Cited

U.S. PATENT DOCUMENTS

| 4,801,937 A | * | 1/1989 | Fernandes .............. 340/870.16 |
| 4,904,996 A | * | 2/1990 | Fernandes .............. 340/870.07 |
| 5,341,088 A | * | 8/1994 | Davis .................... 324/106 |

* cited by examiner

*Primary Examiner*—Ernest Karlsen
(74) *Attorney, Agent, or Firm*—Cantor Colburn LLP

(57) ABSTRACT

A leakage current measurement apparatus for measuring leakage currents is disclosed. The leakage current measurement apparatus automatically selects one of non-inductive shunt resistors of 10Ω, 100Ω, and 1000Ω and measures leakage currents of an outdoor isolation material for an ultra-high voltage. Additionally, the leakage current measurement apparatus is capable of measuring a relatively wide range of leakage currents with a relatively high precision, even at a remote location, as a measurement range is automatically adjusted within measurement ranges preset by a user when leakage currents of an outdoor isolation material change, and being protected against a surge possibly generated by an ultra-high voltage. Also, it can remotely measure in real-time leakage currents of an outdoor isolation material installed at a remote location over Ethernet.

7 Claims, 4 Drawing Sheets

APPARATUS FOR AUTOMATICALLY MEASURING A RELATIVELY WIDE RANGE OF LEAKAGE CURRENTS

BACKGROUND OF THE INVENTION

1. Field of the Invention

The present invention relates to a leakage current measurement apparatus for automatically selecting one of non-inductive shunt resistors of 10Ω, 100Ω, and 1000Ω, and measuring leakage currents of an outdoor isolation material for an ultra-high voltage, and more particularly to a leakage current measurement apparatus capable of measuring a relatively wide range of leakage currents with a relatively high precision, even at a remote location, as a measurement range is automatically adjusted within measurement ranges preset by a user when the leakage currents of an outdoor isolation material changes, and being protected against a surge possibly generated by an ultra-high voltage. Also, it can remotely measure, in real-time, leakage currents of an outdoor isolation material installed at a remote location over Ethernet.

2. Description of the Related Art

The measurement range of leakage currents in a currently used isolation material for electrical power distribution is relatively narrow, and also leakage currents are relatively small. Most apparatuses for measuring leakage currents are of a clamp type. Namely, the clamp type leakage current measurement apparatus can measure leakage currents in a specific range of a few to hundreds of μA. However, if leakage currents are out of the range which can be measured by the clamp type leakage current measurement apparatus, then it must be replaced with a new clamp type measurement apparatus. Namely, the new clamp type measurement apparatus has a new clamp with a large or small capacity different from that of the previously installed clamp. Meanwhile, the clamp type leakage current measurement apparatus measures leakage currents as a clamp is hooked in a measured line, and obtains leakage currents in digital or analog format. Also, the clamp type leakage current measurement apparatus must additionally include an external storage device such that it can store measured data at the measurement performing location, or a temporally installable storage device to store specific data therein.

Meanwhile, even though leakage currents generated in an isolation material for electrical power transmission varies in a relatively wide range such as from a few μA to tens of mA, there has not been known a method capable of reliably and safely measuring such a range of leakage currents in real time when ultra-high voltage is being transmitted. Also, to continuously measure the leakage currents using the prior art apparatus, a user must directly operate it on work site at a time point when a measurement range is changed or is expected to change. Also, to analyze data stored in a storage device pre-installed on work site within a predetermined period of time, a user must directly take the data from the storage device.

The prior art leakage current measurement apparatuses may cause damage to a user, when the user accesses the work site to measure leakage currents of isolation material to which an ultra high voltage is applied. Also, since the prior art apparatus does not have any protection device against a surge voltage and current possibly generated as weather conditions changes in a state that an ultra-high voltage is applied to isolation material, its performance is decreased as time goes by and also its life is shortened.

SUMMARY OF THE INVENTION

Therefore, the present invention has been made in view of the above problems, and it is an object of the present invention to provide an apparatus for automatically selecting non-inductive shunt resistors, and measuring a relatively wide range of leakage currents of an outdoor isolation material for an ultra-high voltage.

It is another object of the present invention to provide an apparatus with non-inductive shunt resistors, capable of automatically selecting one of non-inductive shunt resistors based on leakage current quantities of which changes are caused by weather change and weakening of isolation material for electrical power transmission, and measuring a relatively wide range of leakage currents of an isolation material for an ultra-high voltage.

It is a further object of the present invention to provide an apparatus for automatically measuring a relatively wide range of leakage currents, capable of securing user safety and effectively removing surges, lightening strikes, and noise therefrom.

In accordance with the present invention, the above and other objects can be accomplished by the provision of a leakage current measurement apparatus for automatically measuring a relatively wide range of leakage currents, comprising an auto range selection unit having three non-inductive shunt resistors, so that a measurement range can be automatically changed based on a change of the relatively wide range of leakage currents, a weather observing unit for measuring a change of leakage currents of an isolation material based on a weather change, a signal processing unit for removing noise from measured leakage currents and amplifying the noise removed leakage currents, a signal transmission unit for transmitting the measured leakage currents and weather data to an observation location, a surge protector for protecting the apparatus from a surge voltage, a data receiving and storing unit for receiving and storing data to display, and a display unit for displaying statuses when a work site is checked.

In accordance with an aspect of the present invention, an apparatus for automatically measuring a relatively wide range of leakage currents can automatically select one of three selection ranges corresponding respectively to three non-inductive shunt resistors, 10Ω, 100Ω and 1000Ω, which are previously set by a user, based on a change of leakage currents, manually or automatically change a measurement range to ensure user safety against a danger of an ultra- or automatically change a measurement range to ensure user safety against a danger of an ultra-high voltage at a remote location over Ethernet, and store measured data in a storage device at the remote location.

Preferably, the apparatus for automatically measuring a relatively wide range of leakage currents includes a surge protector so that it can be protected against a surge voltage and a surge current.

Preferably, the apparatus for automatically measuring a relatively wide range of leakage currents can perform set, control, and measurement operations over Ethernet by an authenticated user located remotely therefrom.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

With reference to the attached drawings, the embodiment of the present invention will be described in detail below.

Figure 1:
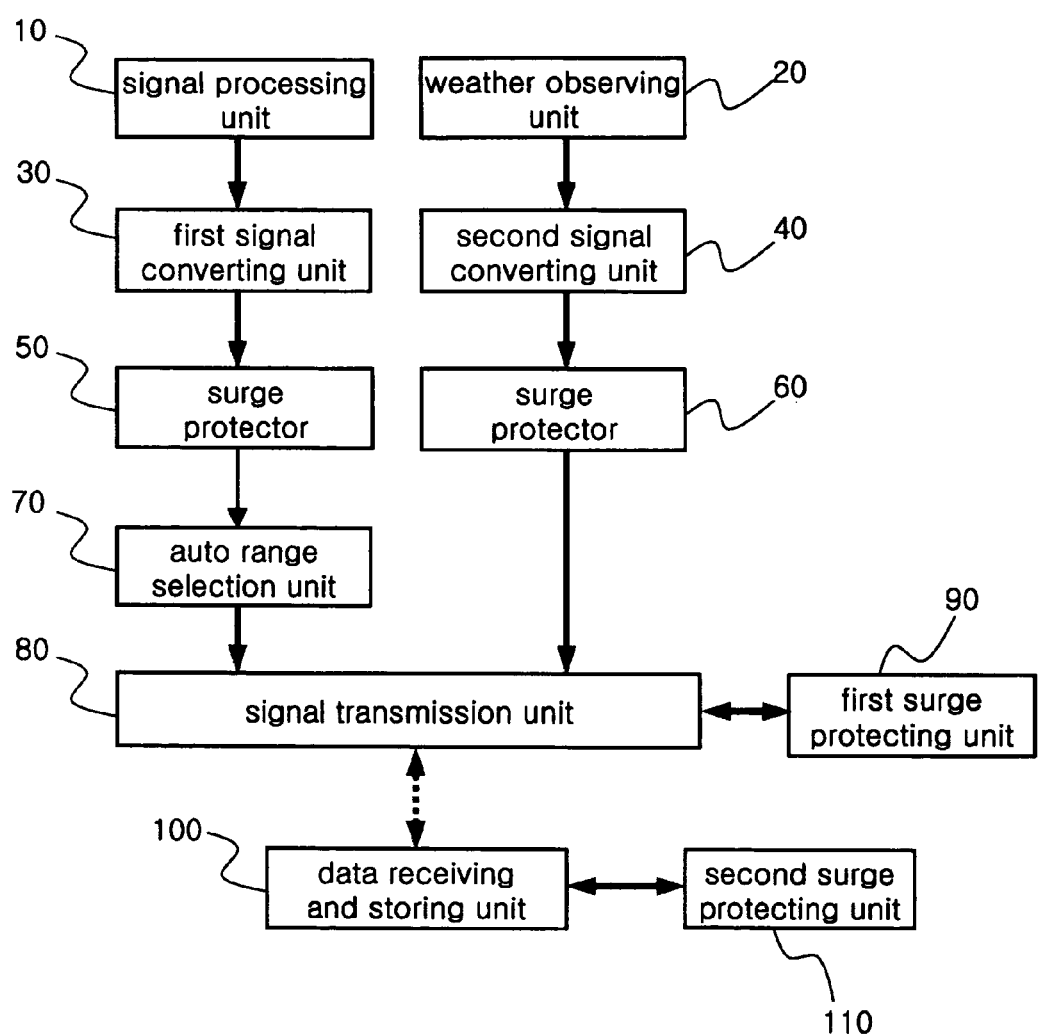
FIG. 1 is a view illustrating a construction of an apparatus for automatically measuring a relatively wide range of leakage currents according to an embodiment of the present invention.

FIG. 1 is a view illustrating a construction of an apparatus for automatically measuring a relatively wide range of leakage currents according to an embodiment of the present invention. The apparatus of the present invention can automatically adjust a measurement range within measurement ranges preset by a user when the leakage currents of isolation material changes, and remotely measure the leakage currents with a relatively high precision as well. Also, the apparatus can be protected against a surge possibly generated by an ultra-high voltage applied thereto. Also, the apparatus can measure leakage currents in real-time at a place remotely located therefrom over Ethernet. Therefore, a worker can be protected against an electrical accident possibly generated by an ultra-high voltage.

The apparatus for automatically measuring a relatively wide range of leakage currents comprises a signal processing unit 10 for measuring leakage currents, an auto range selection unit 70 for automatically selecting a measurement range. Here, the auto range selection unit 70 is connected to the signal processing unit 10 via a first signal converting unit 30 and a first surge protector 50. Also, the apparatus comprises a weather observing unit 20, a second surge protector 60 connected to the weather observing unit 20 via a second signal converting unit 40, a signal transmission unit 80 connected to the auto range selection unit 70 and the second surge protector 60, a data receiving and storing unit 100 connected to the signal transmission unit 80, for transmitting and storing data, a first surge protecting unit 90 connected to the signal transmission unit 80, and a second surge protecting unit 110 connected to the data receiving and storing unit 100.

The leakage currents of an isolation material are measured using a measuring line connected to the isolation material installed to an electrical power line and a ground line. In order to convert a current signal into a voltage signal, non-inductive shunt resistors of 10Ω, 100Ω, and 1000Ω are installed between the measuring and ground lines, one of them is automatically selected based on leakage currents such that a measurement operation can be performed in a relatively wide range of leakage currents.

The weather observing unit 20 measures temperature, humidity, wind direction, and wind speed, which affect leakage currents of an isolation material when they change. The measured data in the weather observing unit 20 enhance reliability of the measured leakage currents when measuring the leakage currents. The values of temperature, humidity, wind direction, and wind speed, which are measured by corresponding sensors, are in the form of analog signals. The analog values are transmitted to the second surge protector 60 together with the measured leakage currents.

When measuring a relatively wide range of leakage currents of an outdoor isolation material for an ultra-high voltage, various types of surges are transmitted through a circuit of the leakage current measurement apparatus. Also, surges (IEC IEV 161-02-01), etc. of current, voltage or power, frequently occur. Here, each surge is shaped as rapidly increased and gradually decreased. Especially, a surge generated when raining and lightening abruptly increases a voltage and current such that the leakage current measurement apparatus can be affected thereby. Also, a surge transmitted through a signal line may output a transient voltage of hundreds of volts, caused by an ultra-high voltage applied to an insulator.

Figure 2A:
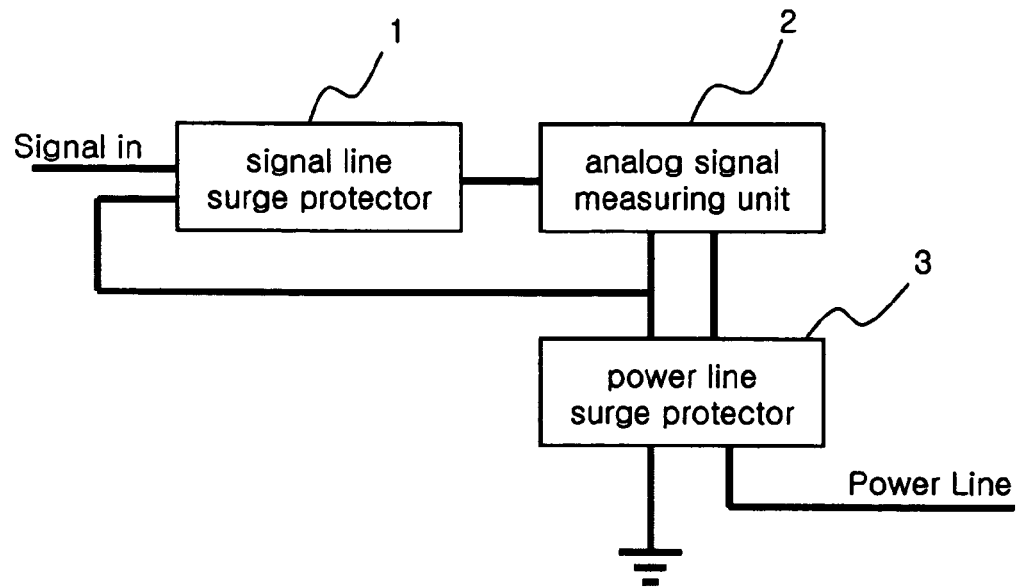
FIG. 2a is a view illustrating a surge protector for protecting the apparatus against a surge voltage according to the present invention.
Figure 2B:
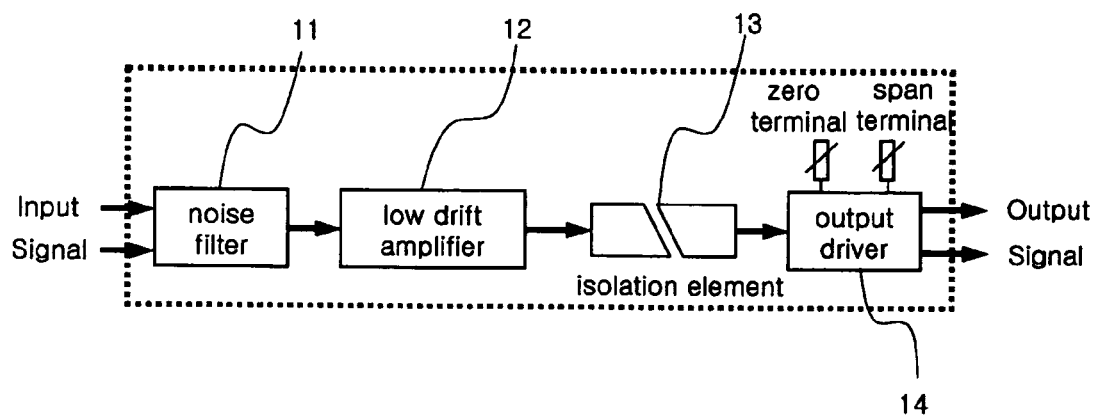
FIG. 2b is a view illustrating a signal processing unit for removing noise from measured leakage currents and amplifying noise removed leakage currents.
Figure 2C:
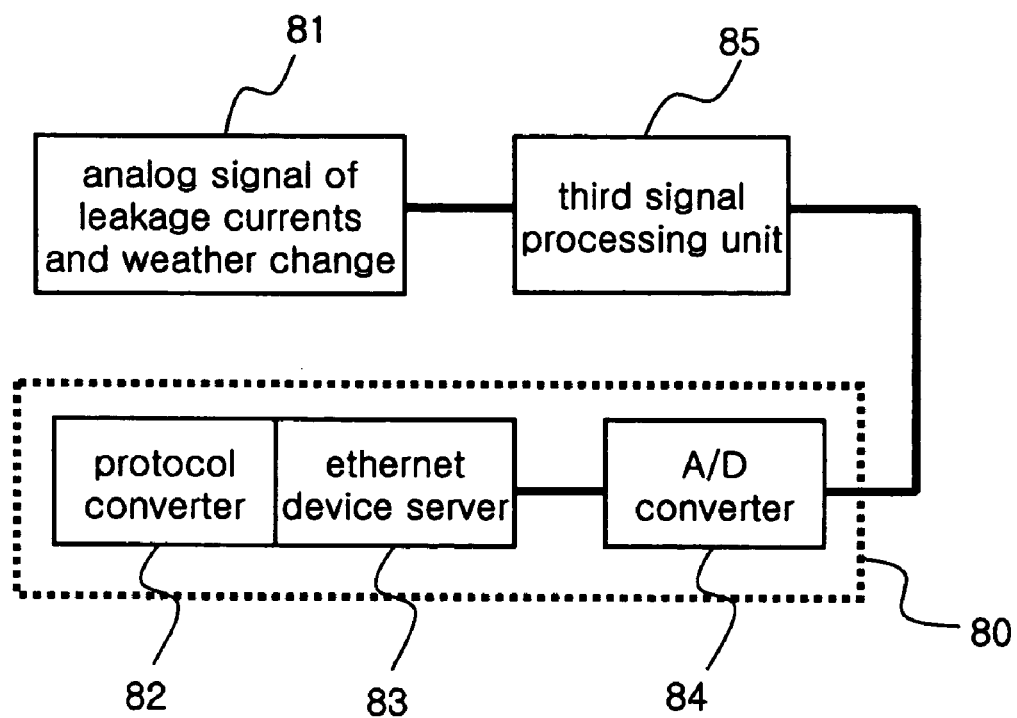
FIG. 2c is a view illustrating a signal transmission unit for transmitting measured leakage currents and weather data to an observation location.

FIG. 2a is a view illustrating a surge protector for protecting the apparatus against a surge voltage according to the present invention. FIG. 2b is a view illustrating a signal processing unit for removing noise from measured leakage currents and amplifying noise removed leakage currents. FIG. 2c is a view illustrating a signal transmission unit for transmitting measured leakage currents and weather data to an observation location.

Since the first and second signal converting units 30 and 40, the signal transmission unit 80 and a SMPS (Switching Mode Power Supply), not shown, etc., are very sensitive to surges such that they can be damaged easily, a signal line surge protector 1 is installed at a power input terminal, as shown in FIG. 2a, in combination with a power line surge protector 3 for signal protection, so that the above elements can be protected against the surge. An analog signal measuring unit 2 is installed between the signal line surge protector 1 and the power line surge protector 3.

The signal processing unit 10 converts and amplifies a measured signal through the second surge protector 60 into a signal within a measurable range in the signal transmission unit 80. The signal processing unit 10, as shown in FIG. 2b, includes a noise filter 11 for removing noise from an input signal, a low drift amplifier 12 for amplifying a noise removed signal and linearizing it, an isolation element 13 having an electrical isolation function, and an output driver 14 connected to zero and span terminals.

More specifically, the noise filter 11 removes noise from the input signal. The low drift amplifier 12 amplifies a noise removed signal to a predetermined level of thereof, and linearizes an AC signal to a DC signal. The isolation element 13 physically separates the input signal side and the output signal, so that a secondary surge and abnormal signals can be transmitted from the input signal side to the output signal side, thereby protecting the apparatus against damage.

The signal transmission unit 80 as shown in FIG. 2c includes an A/D converting unit 84 for converting leakage currents and weather data inputted from the signal processing unit 10 into a transmitable digital signal. The converted digital signal is processed by a communication protocol of an Ethernet device server 83 so that it can be transmitted over Ethernet, and then the processed signal is transmitted to an observing unit 20 over Ethernet when data corresponding the processed signal is required. The Ethernet device server 83 is connected to the protocol converter 82 and the A/D converting unit 84. The A/D converting unit 84 is connected to a third signal converting unit 85, and receives the leakage currents and the weather analog signal through the third signal converting unit 85.

The signal transmission unit 80 is accessible by a plurality of clients so that they can simultaneously observe leakage currents. Therefore, even though there is a specific client in an abnormal state, the leakage currents can be successively measured and monitored by other clients such that the leakage currents can be measured with a relatively high stability. Meanwhile, the Ethernet device server 83 requires a user authentication system to prevent users with malicious intent from connecting thereto. Therefore, only simultaneous subnet mask authenticated users are capable of changing the setting of the Ethernet device server 83.

The data receiving and storing unit 100 receives data transmitted over Ethernet to re-analyze it based on a communication protocol, displays it on a display unit of a Personal Computer (PC) and stores it. Namely, the PC at a remote monitoring location can monitor the state of the measurement apparatus and receive data therefrom. The received data is displayed on the display unit in the form of graphs and figures so that they can be analyzed to associate with weather conditions, applying voltage etc. at respective measuring insulators.

The data receiving and storing unit 100 can set a measuring speed, a user registration, measurement ranges by an automatic or manual selection, auto range selection conditions etc. of the measurement apparatus. The auto range selection unit 70 can automatically and manually change measurement ranges according to a change of leakage currents based on the set auto range selection conditions. An auto range selection mode of a measuring range is set in the data receiving and storing unit 100 to automatically change the measurement range, and then auto range selection conditions are set.

The auto range selection conditions include a weather change or a change of leakage currents. If the auto range selection condition reaches a predetermined condition, as shown in FIG. 3, a measurement range change command is transmitted from the data receiving and storing unit 100 to the signal transmission unit 80.

Figure 3:
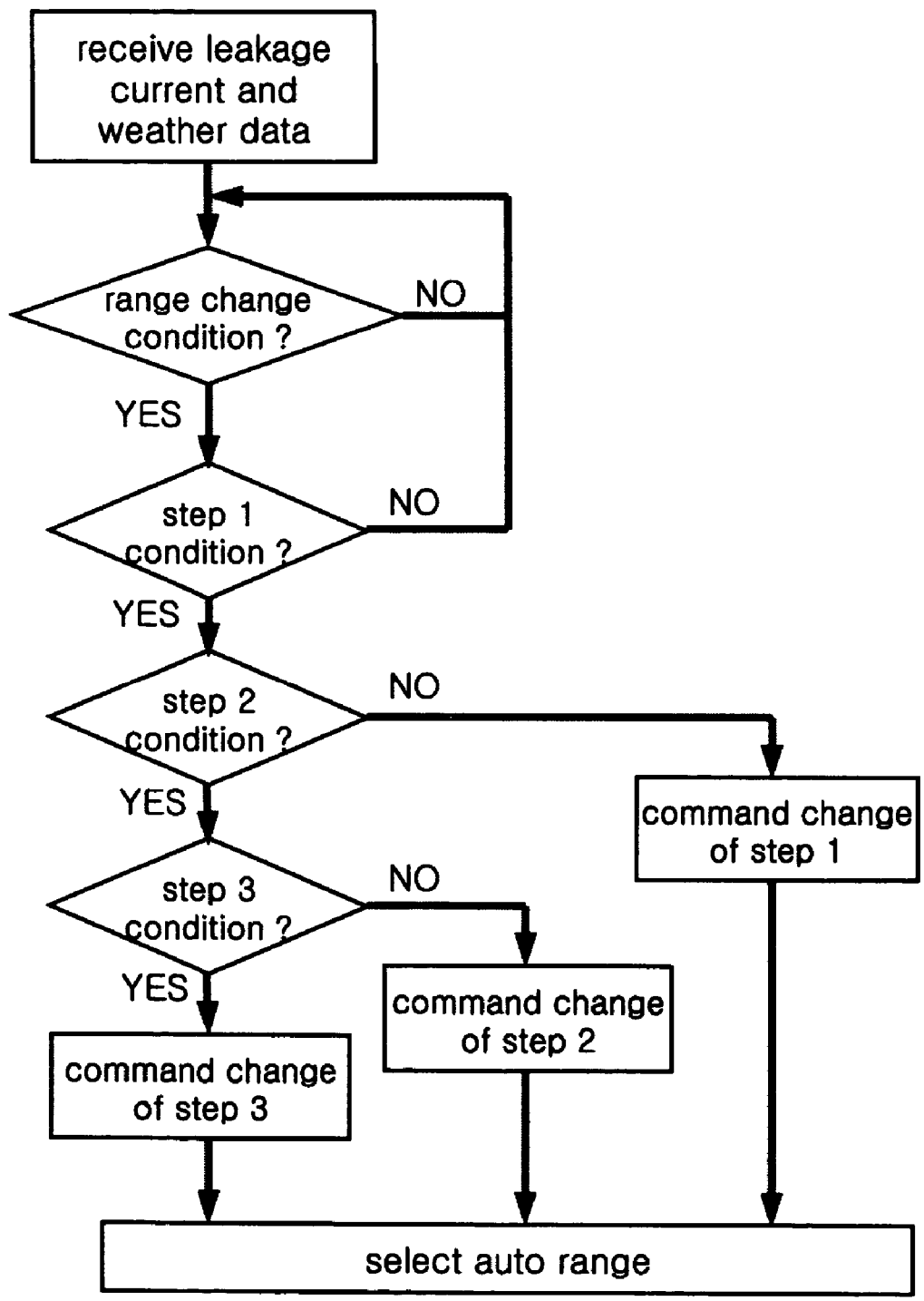
FIG. 3 is a flowchart illustrating an operating method of an auto range selection unit for selecting one of non-inductive shunt resistors and measuring a relatively wide range of leakage currents.

FIG. 3 is a flowchart illustrating an operating method of an auto range selection unit 70 for selecting one of non-inductive shunt resistors and measuring a relatively wide range of leakage currents. As shown in FIG. 3, when the auto range selection unit 70 receives leakage currents, weather data, to obtain range change conditions therefrom, then the range of the auto 10 range selection unit 70 is selected through the signal processing unit 80 by steps 1 to 3 change commands based on steps 1 to 3 conditions in the data receiving and storing unit 100.

Namely, the data signal transmission unit 80 receiving the measurement range change command outputs the change command to the auto range selection unit 70 again, such that the auto range selection unit 70 is changed to corresponding range based on the received change command. When automatically changing the measurement range, switching to an upper measurement range is automatically changed by an auto range selection condition, and switching to a lower measurement range is changed when a condition is satisfied with less than 5% of the auto range selection condition. When switching to the upper or lower measurement range by the auto range selection condition, since the measurement range switching frequently occurs in a condition similar to the auto range selection condition, the above setting serves to prevent that the measurement apparatus may improperly operate, and measured values may be lost.

Also, data measured right before or after automatically changing measurement range is only referred to for internal control, and is not stored, so that the measurement apparatus has a stable measured value. A manual change of a measurement range is set in the data receiving and storing unit 100. If a measurement range is arbitrarily set by a user, a manual change command is transmitted from the data receiving and storing unit 100 to the auto range selection unit 70 through the signal processing unit 80, so that it can be changed to a specific measurement range.

A display unit displays states of leakage currents of an isolation material and weather conditions when the measurement apparatus is calibrated at a work site. Also, the display unit has an automatic temperature controller installed therein in order to increase stability of the measurement apparatus according to the season. For example, if the temperature of the measurement apparatus is less than a predetermined temperature set by a user in winter, the auto temperature controller operates a heater so that the temperature of the measurement apparatus is maintained above the predetermined temperature.

Even if the apparatus of the present invention is not connected to Ethernet, it can be directly connected to a PC via a communication cable for measuring leakage currents. Also, the measurement apparatus of the present invention can communicate via a wireless Internet service without requiring Ethernet line.

As such, the measurement apparatus of the present invention can be set remotely over Ethernet to measure a relatively wide range of leakage currents of an outdoor isolation material for an ultra-high voltage as three non-inductive shunt resistors are automatically selected to change its measuring range based on the measured leakage currents. Therefore, the measurement apparatus of the present invention has advantages that it can protect a user against an ultra-high voltage and also easily utilize data remotely measured in real-time over Ethernet.

Also, the apparatus can be protected against a surge voltage and current by surge protectors installed in a signal line and a power line, therefore its performance is enhanced and its life can be extended. The measurement apparatus of the present invention can be accessed by an authenticated user over Ethernet.

The measurement apparatus of the present invention enables a user to safely and effectively measure leakage currents and has relatively high stability. Also, the apparatus requires relatively little maintenance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for automatically measuring a relatively wide range of leakage currents, comprising:
   an auto range selection unit having three non-inductive shunt resistors, so that a measurement range can be automatically changed based on a change of the relatively wide range of leakage currents;
   a weather observing unit for measuring a change of leakage currents of an isolation material based on a weather change;
   a signal processing unit for removing noise from measured leakage currents and amplifying the noise removed leakage currents;

a signal transmission unit for transmitting the measured leakage currents and weather data to an observation location;

a surge protector for protecting the apparatus from a surge voltage;

a data receiving and storing unit for receiving and storing data to display; and a display unit for displaying statuses when a work site is checked.

2. The apparatus as set forth in claim 1, wherein the auto range selection unit automatically selects one of three non-inductive shunt resistors, 10Ω, 100Ω, and 1000Ω, if measure leakage currents are out of measurement ranges previously set by a user, remotely measures the leakage currents in real-time at a remote location over Ethernet and controls the apparatus in real-time based on the measurement over Ethernet, whereby the user can be protected against a danger and obtain data with a relatively high reliability, and the apparatus can be protected against surges possibly generated by an ultra-high voltage.

3. The apparatus as set forth in claim 1, wherein the auto range selection unit is connected to the signal processing unit via a signal converting unit and the surge protector;

the weather observing unit is connected to the surge protector via the signal converting unit;

the signal transmission unit is connected to the auto range selection unit and the surge protector;

the data receiving and storing unit are connected to the signal transmission unit, for transmitting and storing data;

the first surge protecting unit is connected to the signal transmission unit; and the second surge protecting unit is connected to the data receiving and storing unit.

4. The apparatus as set forth in claim 1, wherein the signal processing unit removes noise of input signals inputted into a noise filter, enables a low drift amplifier to amplify the noise removed input signal to have a predetermined level and to linearize an AC signal to a DC signal, and physically separates an input and out signal sides using an isolation element to break a secondary surge and an abnormal signal, whereby the apparatus can be protected against a damage.

5. The apparatus as set forth in claim 1, wherein the auto range selection unit is operated by auto range selection conditions including the weather change or the change of leakage currents, wherein if one of the auto range selection conditions is satisfied with a predetermined condition, a measurement range change command is automatically transmitted from the data receiving and storing unit to the signal transmission unit.

6. The apparatus as set forth in claim 3, wherein the signal processing unit removes noise of input signals inputted into a noise filter, enables a low drift amplifier to amplify the noise removed input signal to have a predetermined level and to linearize an AC signal to a DC signal, and physically separates an input and out signal sides using an isolation element to break a secondary surge and an abnormal signal, whereby the apparatus can be protected against a damage.

7. The apparatus as set forth in claim 3, wherein the auto range selection unit is operated by auto range selection conditions including the weather change or the change of leakage currents, wherein if one of the auto range selection conditions is satisfied with a predetermined condition, a measurement range change command is automatically transmitted from the data receiving and storing unit to the signal transmission unit.

* * * * *